United States Patent [19]

Lee

[11] Patent Number: 5,050,114

[45] Date of Patent: Sep. 17, 1991

[54] SIMULATION OF TWO-PHASE LIQUID COOLING FOR THERMAL PREDICTION OF DIRECT LIQUID COOLING SCHEMES

[75] Inventor: Tien-Yu T. Lee, Schottsdale, Ariz.

[73] Assignee: Motorola, Inc., Schaumburg, Ill.

[21] Appl. No.: 583,759

[22] Filed: Sep. 17, 1990

[51] Int. Cl.$^5$ .............................................. G06F 15/20
[52] U.S. Cl. ........................................ 364/578; 357/82
[58] Field of Search .......................... 364/551.01, 578; 361/385; 357/82, 81, 83

[56] References Cited

U.S. PATENT DOCUMENTS

| | | | |
|---|---|---|---|
| 4,590,538 | 5/1986 | Cray, Jr. ............................ | 361/385 |
| 4,694,378 | 9/1987 | Nakayama et al. ................. | 361/385 |
| 4,704,658 | 11/1987 | Yokouchi et al. .................. | 361/385 |
| 4,772,980 | 9/1988 | Curtis et al. ...................... | 361/385 |
| 4,847,731 | 7/1989 | Smolley ............................. | 361/385 |
| 4,884,169 | 11/1989 | Cutchaw ............................ | 361/385 |

*Primary Examiner*—Salvatore Cangialosi
*Attorney, Agent, or Firm*—Joe E. Barbee

[57] ABSTRACT

A method for predicting the optimum operating conditions for a two-phase liquid cooling environment using simulation software utilizes a data base containing properties for several liquid coolants. A coolant is selected from the data base, and a cooling scheme is designated. Physical properties related to an integrated circuit are entered, includinhg circuit surface heat flux. A coolant temperature and flow rate are selected. The operating conditions for the integrated circuit are calculated based upon the cooling scheme and test conditions, including calculating boiling incipience heat flux and critical heat flux. The circuit surface heat flux is compared to the boiling incipience heat flux and critical heat flux to determine if the test conditions provide for nucleate boiling. The calculations are repeated for additional temperatures and flow rates. Results are displayed in printed or graphic form.

6 Claims, 2 Drawing Sheets

SIMULATION OF TWO-PHASE LIQUID COOLING FOR THERMAL PREDICTION OF DIRECT LIQUID COOLING SCHEMES

BACKGROUND OF THE INVENTION

The present invention relates, in general, to simulation software and, more particularly, to the simulation of direct liquid cooling procedures to determine proper operating conditions for two-phase liquid cooling of integrated circuits.

High power single chip and multichip products demand advanced thermal packaging design to maintain circuit junction temperatures within an allowable range. These high power products include emitter coupled logic (ECL) gate arrays, BIMOS gate arrays, high end microprocessors, etc. Due to the nature of high power dissipation, i.e., circuit surface heat flux in the range of thirty to sixty watts per square centimeter, conventional air-cooled and indirect water cooled multichip module (MCM) packages may not be appropriate. Direct liquid cooling with phase change, or "two-phase liquid cooling", offers the most efficient heat transfer process and thus is one of the alternatives for advanced MCM thermal design. With phase change, i.e., from liquid to vapor, nucleate boiling at the surface of the integrated circuit package enhances heat transfer. This enhancement results in stable junction temperatures even under conditions of high surface heat flux.

In the past, optimizing the operating conditions for two-phase liquid cooling was a laborious, time consuming process. For each cooling scheme, whether by immersion, flow, jet impingement, or any other possible cooling method, a separate test fixture had to be manufactured. In the case of jet impingement, several different fixtures had to be constructed, representing different jet nozzle configurations. For each individual fixture, a matrix of experiments was performed. Different devices of different sizes and having different power dissipations were tested using a variety of different liquid coolants. For each liquid coolant, a matrix of temperatures and flow rates were tested at multiple system pressures. Physical observation was used to determine if the device under test was operating under nucleate boiling conditions. Testing the limits of cooling capability sometimes led to destruction of the device under test. The amount of work involved prevented making truly accurate determinations as to optimum cooling scheme, fluid temperature, and flow rate.

SUMMARY OF THE INVENTION

The objects and advantages of the present invention are provided by a method for predicting the optimum operating conditions for a two-phase liquid cooling environment using simulation software. The method utilizes a data base containing physical and thermodynamic properties for several liquid coolants. A liquid coolant is selected from the data base, and a cooling scheme is designated. The physical properties related to an integrated circuit are entered, including circuit surface heat flux and system pressure. A coolant temperature and a flow rate are selected from a range of temperatures and flow rates. The operating conditions for the integrated circuit are calculated based upon the cooling scheme and test conditions, including calculating boiling incipience heat flux and critical heat flux. The heat flux of the integrated circuit is compared to the calculated boiling incipience heat flux and critical heat flux to determine if the test conditions provide for nucleate boiling. All calculated data are recorded. The calculations are repeated for additional sets of test conditions from the range of temperatures and flow rates until the entire range of temperatures and flow rates has been selected. Results are displayed in printed or graphic form.

DETAILED DESCRIPTION OF THE DRAWINGS

Figure 1:
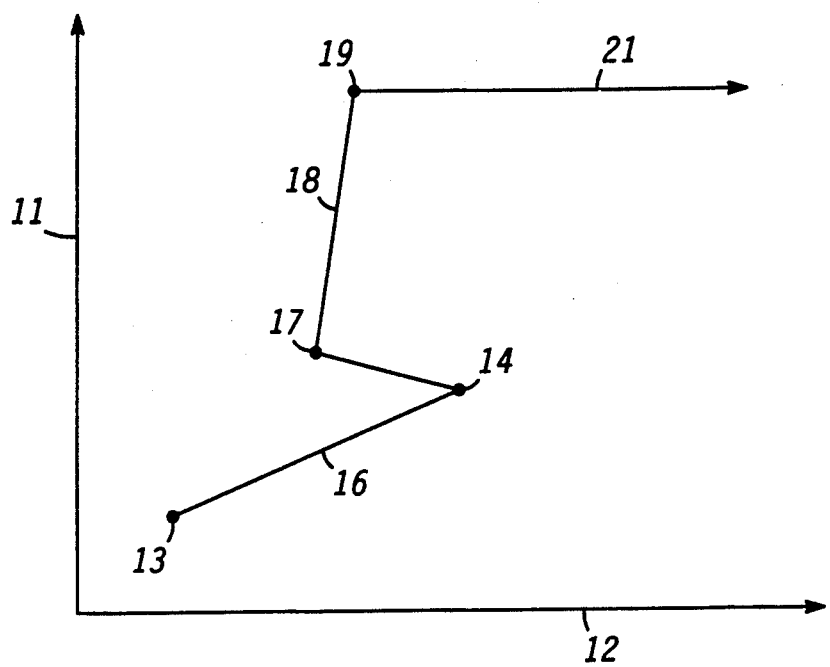
FIG. 1 is a graph illustrating the boiling heat transfer process.

In order to fully appreciate the function of the present invention, the boiling heat transfer process is first reviewed. FIG. 1 is a graph illustrating the boiling heat transfer process. Vertical axis 11 represents the heat flux of a heated surface in contact with a fluid coolant. In the application for which the present invention is intended, the heated surface is the surface of an integrated circuit package, hereafter referred to simply as the integrated circuit. Heat flux is a function of the power dissipation of the integrated circuit and the surface area of the integrated circuit exposed to the coolant. Heat flux is measured in watts per square centimeter. Horizontal axis 12 represents the temperature of the integrated circuit. Normally, axis 12 is plotted as the difference between the temperature of the integrated circuit and the saturation temperature, or boiling point, of the coolant in units of degrees Celsius.

As heat flux increases along axis 11, the temperature of the heated surface increases, and the graph moves from point 13 to point 14. Region 16 from point 13 to point 14 represents single phase liquid cooling. The coolant in contact with the heated surface remains in a liquid state as heat is transferred from the heated surface to the coolant. At point 14, the coolant in contact with the heated surface begins to boil. At this point, the boiling action is known as nucleate boiling. Nucleate boiling is characterized by tiny vapor bubbles which form upon the heated surface, detach, and condense back into a liquid state in the bulk of the fluid coolant.

A peculiarity of certain fluids causes the sudden negative transition in temperature from point 14 to point 17. The tiny bubbles which initiate nucleate boiling form initially in tiny cavities on the heated surface. These cavities can either be imperfections in the heated surface, or may be purposely formed for this specific reason. Low-wetting fluids, such as water, do not flow easily into these cavities, and nucleate boiling begins slightly above the boiling point of the fluid. With high-wetting fluids, such as fluorocarbons, the fluid easily flows into the cavities, condensing the tiny bubbles before they grow large enough to have a significant cooling effect. Therefore, the heated surface continues to rise in temperature as the heat flux rises, reaching superheated temperatures significantly above the boiling point of the fluid. At point 14, the heat flux is high enough to impart sufficient energy to the fluid coolant in contact with the heated surface to sustain vaporization of the coolant. The heat flux at point 14 is thus known as the boiling incipience heat flux. The temperature of the heated surface quickly cools to a lower temperature at point 17, sufficient to maintain nucleate boiling. This phenomenon is called thermal overshoot. Thermal overshoot is undesirable, and must be controlled. It is essential that the temperature at point 14 is not so high as to cause damage. Note that the temperature of the heated surface at point 17 is still above the boiling point of the fluid.

Once past point 17, the heated surface maintains a fairly constant temperature in region 18. This is the nucleate boiling region. As heat flux continues to increase toward point 19, there is an increase in the number of vapor bubbles upon the heated surface as more energy is imparted to the coolant. At point 19 the vapor bubbles become so dense that they join, and the heated surface is covered by a vapor film. Since liquid coolant is no longer coming into contact with the heated surface, the temperature of the heated surface is no long controlled. Region 21, the film boiling region, beginning at point 19, is characterized by a dramatic temperature rise. This large temperature jump may create catastrophic damage to the heated surface. The heat flux at point 19 is thus designated as the critical heat flux.

Nucleate boiling region 18 is the ideal region for the operation of an integrated circuit. Proper operating conditions of coolant temperature, coolant flow rate, and system pressure are required to ensure that the integrated circuit surface stays in this region. The present invention is used to determine these operating conditions.

Figure 2:
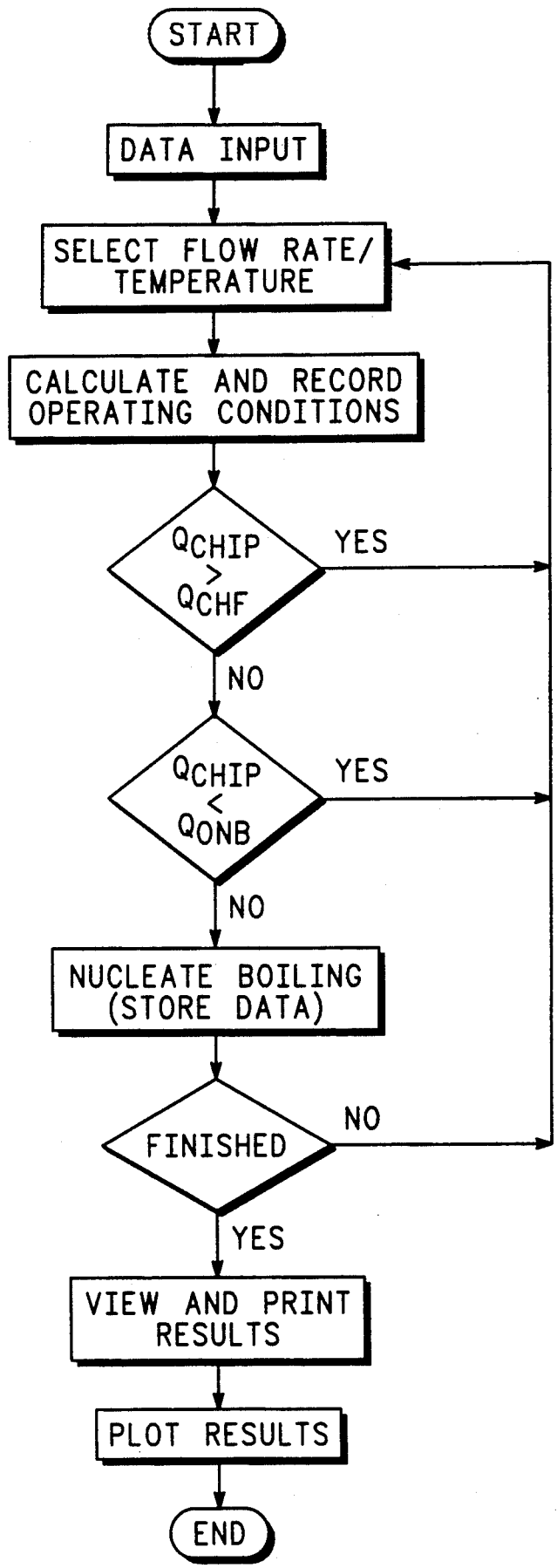
FIG. 2 is a flow chart of an embodiment of the present invention.

FIG. 2 is a flow chart of an embodiment of the present invention. The flow chart of FIG. 2 describes a software program which begins with the input all of the data required by the program. Much of the data, particularly that pertaining to various coolants, resides in a pair of pre-accumulated data bases. The first data base comprises a table of various physical properties at different pressures. Included are boiling points, densities, surface tensions, kinematic viscosities, specific heats, thermal conductivities, coefficients of thermal expansion, and average molecular weights. Thermodynamic properties such as densities of saturated liquid, densities of saturated vapors, and enthalpies of evaporation are also included in the first data base. Typical coolants include fully fluorinated fluorocarbon compounds such as FC-72, FC-77, FC-84, and FC-87, which are products of 3M Corp., and chlorinated Freon-113, which is a product of DuPont. To add additional coolants to those to be tested, one merely needs to add the appropriate data to the first data base. The program requires one to select a coolant, then accesses the appropriate information held in the first data base.

A second data base contains data on heat transfer characteristics of a variety of cooling schemes. Data is collected from existing literature, and can be easily modified to reflect updated experimental results. Typical cooling schemes are pool or immersion cooling, flow cooling, and jet impingement cooling. In pool cooling, the integrated circuits are immersed in a stationary pool (flow rate equals zero) of sub-cooled coolant. Sub-cooling is a measurement of how far the temperature of the coolant is below its boiling point. Thus, a coolant sub-cooled twenty-five degrees, for example, is twenty-five degrees below the boiling point of the coolant. This provides for a normalized point of reference for comparing various coolants. The orientation of the integrated circuits, whether vertical or horizontal, effects the performance of the coolant in pool boiling. The program must therefore be informed of the desired orientation.

In flow cooling, the coolant flows through a channel which directs the coolant across the heated surfaces of the integrated circuits. In this case, the size of the channel must be input. With jet impingement cooling, the geometry, size, and number of jets per integrated circuit are required data inputs. After a cooling scheme is selected, the program uses the input information to extract the proper heat transfer characteristics from the second data base.

Other required data inputs to the program include the packaging model, the system pressure, the integrated circuit heating length, and the maximum heat flux of the integrated circuit. The heating length is the dimension of the integrated circuit parallel to the flow of the coolant. Coolant flow rate and sub-cooling are not required inputs. The program automatically sets a flow rate range of from one half to eight meters per second, with an increment of one half meter per second, and a sub-cooling range of from zero to fifty degrees Celsius with an increment of five degree Celsius. For pool boiling the flow rate is set to zero.

The program selects initial flow rate and sub-cooling point test conditions, and then begins making calculations. First, thermodynamic properties of the selected coolant based upon system pressure are looked up in the first data base. Then physical properties are looked up in the first data base. Based upon these properties, the heat transfer characteristics of the selected cooling scheme obtained from the second data base, and data entered directly into the program, the surface temperature of the integrated circuit at boiling incipience and the boiling incipience heat flux, both at point 14 in FIG. 1, are calculated. The temperature of the integrated circuit in the nucleate boiling region, point 17 in FIG. 1 is calculated, followed by the calculation of the critical heat flux and integrated circuit temperature at point 19 of FIG. 1. Also calculated is the temperature of integrated circuit for the specified maximum heat flux, as well as integrated circuit temperatures for heat flux in single phase region 16 of FIG. 1.

After the above data is recorded, the maximum heat flux of the integrated circuit is compared to the critical heat flux. If the maximum heat flux of the integrated circuit is greater than the critical heat flux, the integrated circuit is operating in film boiling region 21. The selected flow rate and sub-cooling test conditions are rejected, the program returns to select another set of test conditions, and the program continues by making another set of calculations. If the maximum heat flux of the integrated circuit is less than the critical heat flux, the maximum heat flux is compared to the boiling incipience heat flux. If the maximum heat flux of the integrated circuit is less than the boiling incipience heat flux, the integrated circuit is operating in single phase region 16. The program returns to select another set of test conditions, and the program continues by making another set of calculations. If the maximum heat flux of the integrated circuit is greater than the boiling incipience heat flux, the integrated circuit is operating in nucleate boiling region 18. The results are recorded, and the program returns to select another set of test conditions. This loop continues until the entire range of test conditions has been selected.

Figure 3:
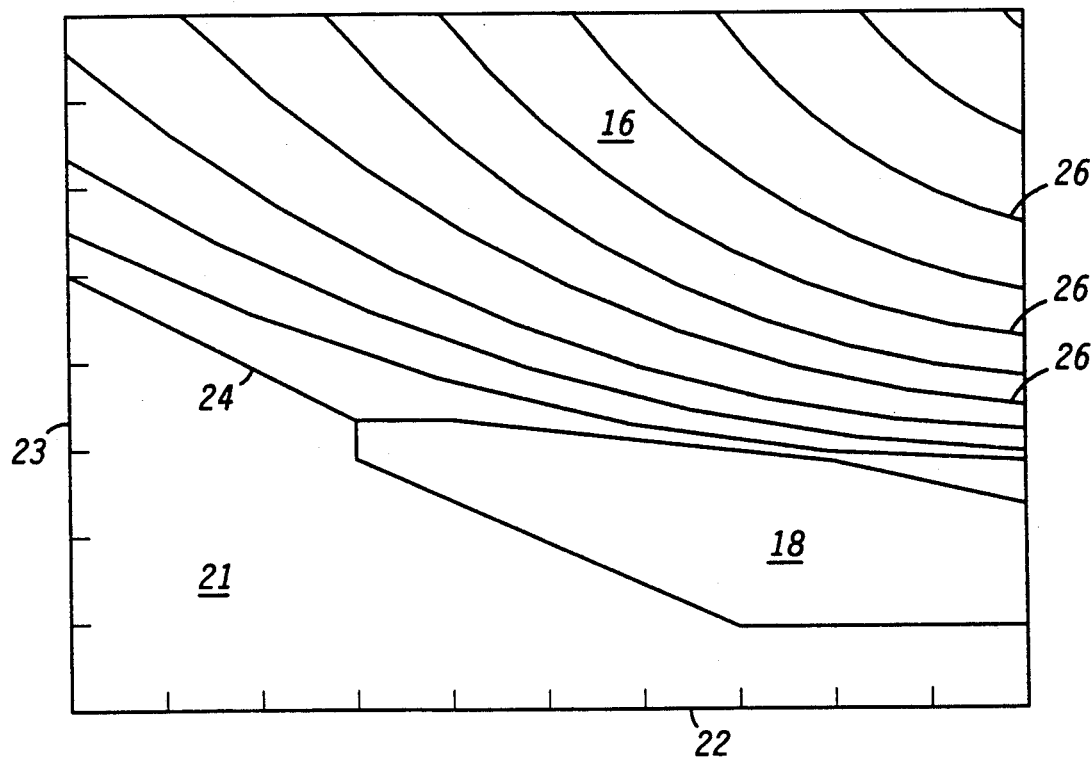
FIG. 3 is a graph illustrating typical results obtained by using the present invention.

The resulting output can be displayed in either text or graphic form. FIG. 3 is a graph illustrating typical results. Horizontal axis 22 is the degree of sub-cooling of the coolant in degrees Celsius. Vertical axis 23 is the flow rate of the coolant in meters per second. Region 21 is, as before, the film boiling region. A point located in region 21 indicates that the flow rate is too low, the sub-cooling is insufficient (temperature too high) or both. Line 24 represents the lower limit of single phase region 16. If a point lies above line 24 in region 16, the flow rate is too fast, the sub-cooling is too great (temperature too low), or both, preventing nucleate boiling. Lines 26 are isotherms, representing the temperature of the integrated circuit at specific sub-cooling and flow rates in single-phase region 16. Region 18 is the nucleate boiling region. The graph of FIG. 3 thus provides the information needed to choose appropriate flow rates and sub-cooling to maintain the integrated circuit within nucleate boiling region 18, given a cooling scheme, coolant type, and system pressure. Additional program runs which vary the input parameters are made to determine the optimum cooling scheme for a given application.

By now it should be appreciated that a time efficient method has been provided which predicts the proper operating conditions for a two-phase liquid cooled system. Based upon pre-accumulated data bases and input data, a set of operating conditions are tested to determine suitability. Data is output in a form to aid in determining the optimum operating conditions.

I claim:
1. A method for predicting optimal operating conditions for two-phase liquid cooling of integrated circuits, comprising;
   providing a data base which contains physical and thermodynamic properties for a plurality of liquid coolants used in a plurality of cooling schemes;
   selecting one of the plurality of liquid coolants and one of the plurality of cooling schemes from the data base;
   entering physical properties related to an integrated circuit, at least comprising entering integrated circuit surface heat flux;
   selecting a temperature and a flow rate as a set of test conditions for the selected liquid coolant from a range of temperatures and flow rates;
   calculating operating conditions for the integrated circuit based upon the selected cooling scheme and test conditions, at least comprising calculating boiling incipience heat flux and critical heat flux;
   comparing the heat flux of the integrated circuit to the calculated boiling incipience heat flux and critical heat flux to determine if the test conditions provide for nucleate boiling;
   repeating the method, beginning with selecting a temperature and a flow rate, until the entire range of temperatures and flow rates has been selected;
   displaying results in printed or graphic form; and
   using the results displayed to choose an appropriate flow rate for the selected liquid coolant.

2. The method of claim 1 wherein providing a data base comprises:
   providing tables for densities of saturated liquid, densities of saturated vapor, and enthalpies of evaporation based upon system pressure;
   providing average molecular weights;
   providing equations of state;
   providing equations for calculating boiling temperatures, surface tensions, kinematic viscosities, specific heats, thermal conductivities, volumetric coefficients of thermal expansion; and
   providing heat transfer characteristics for the plurality of liquid coolants.

3. The method of claim 1 wherein entering physical properties additionally comprises entering a packaging model, integrated circuit heating length, and system pressure.

4. The method of claim 1 wherein calculating operating conditions additionally comprises calculating a single phase heat transfer coefficient, integrated circuit temperature at boiling incipience, integrated circuit temperature at nucleate boiling, density of saturated liquid and a density of saturated vapor, enthalpy of evaporation, surface tension, kinematic viscosity, specific heat, thermal conductivity, and thermal expansion coefficient.

5. A method for determining operating parameters required to sustain nucleate boiling activity in a two-phase liquid cooling scheme used to cool an integrated circuit having a high surface heat flux, comprising:
   calculating boiling incipience heat flux and critical heat flux for the cooling scheme based upon predetermined test conditions;
   comparing the boiling incipience heat flux and the critical heat flux to the surface heat flux of the integrated circuit to determine whether the specified test conditions provide for nucleate boiling; and
   selecting an appropriate flow rate for a two-phase liquid coolant chosen for the cooling scheme.

6. The method of claim 5 wherein the specified test conditions are determined to provide for nucleate boiling if the surface heat flux of the integrated circuit is greater than the boiling incipience heat flux and less than the critical heat flux.

* * * * *